US010447192B2

(12) United States Patent
Lepage

(10) Patent No.: US 10,447,192 B2
(45) Date of Patent: Oct. 15, 2019

(54) ELECTRIC ENERGY CONVERTER, POWER TRAIN COMPRISING SUCH A CONVERTER AND RELATED ELECTRIC TRANSPORT VEHICLE

(71) Applicant: ALSTOM TRANSPORT TECHNOLOGIES, Saint-Ouen (FR)

(72) Inventor: Jean-Pierre Lepage, Bours (FR)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 0 days.

(21) Appl. No.: 15/476,570

(22) Filed: Mar. 31, 2017

(65) Prior Publication Data

US 2017/0288592 A1  Oct. 5, 2017

(30) Foreign Application Priority Data

Apr. 1, 2016 (FR) ...................... 16 52865

(51) Int. Cl.
*H02M 7/5387* (2007.01)
*H03K 17/14* (2006.01)
(Continued)

(52) U.S. Cl.
CPC ................ *H02P 27/06* (2013.01); *B61C 3/00* (2013.01); *H02M 1/088* (2013.01); *H02M 7/537* (2013.01); *H02M 7/5387* (2013.01); *H03K 17/12* (2013.01)

(58) Field of Classification Search
CPC ............. H02M 7/53873; H03K 17/145; B60L 15/025; B60L 11/123
See application file for complete search history.

(56) References Cited

U.S. PATENT DOCUMENTS

2002/0057065 A1* 5/2002 Arimitsu ............... B60L 15/025
318/34
2008/0246426 A1* 10/2008 Aoki ................. H02M 7/53873
318/461

(Continued)

FOREIGN PATENT DOCUMENTS

JP          H08213890         8/1996

OTHER PUBLICATIONS

Preliminary Search Report for FR 1652865, completed Nov. 23, 2016.

*Primary Examiner* — Bickey Dhakal
*Assistant Examiner* — Cortez M Cook
(74) *Attorney, Agent, or Firm* — B. Aaron Schulman, Esq.; Stites & Harbison, PLLC

(57) ABSTRACT

An electric energy converter for converting a first energy into a second energy comprises two first terminals for the first energy, at least one second terminal for the second electric energy, P switching arms, each including two switching half-arms connected in series between the two first terminals and connected to one another at a midpoint that is connected to a respective second terminal. Each half-arm including N switching half-branches connected in parallel, N≥2, each switching half-branch including a switch. This converter further comprises 2×P control modules, each control module being configured to control the switches of a respective half-arm, each control module including an output terminal for each respective switch, each output terminal being configured to deliver a control signal for said respective switch.

9 Claims, 2 Drawing Sheets

(51) Int. Cl.
*B60L 15/02* (2006.01)
*H02P 27/06* (2006.01)
*B61C 3/00* (2006.01)
*H02M 7/537* (2006.01)
*H02M 1/088* (2006.01)
*H03K 17/12* (2006.01)

(56) References Cited

U.S. PATENT DOCUMENTS

| | | | |
|---|---|---|---|
| 2010/0019807 A1* | 1/2010 | Zhang | H03K 17/145 |
| | | | 327/109 |
| 2012/0139460 A1* | 6/2012 | Senkou | H02P 21/50 |
| | | | 318/400.02 |
| 2013/0039100 A1 | 2/2013 | Kazama et al. | |
| 2013/0141027 A1* | 6/2013 | Nakata | H02P 6/08 |
| | | | 318/400.23 |
| 2013/0328599 A1 | 12/2013 | Lobsiger et al. | |
| 2015/0015169 A1* | 1/2015 | Yanagi | H02P 6/24 |
| | | | 318/400.02 |
| 2016/0126822 A1* | 5/2016 | Lyle | H02M 1/088 |
| | | | 363/123 |
| 2018/0262123 A1* | 9/2018 | Kalygin | H02M 5/4585 |

* cited by examiner

ELECTRIC ENERGY CONVERTER, POWER TRAIN COMPRISING SUCH A CONVERTER AND RELATED ELECTRIC TRANSPORT VEHICLE

FIELD OF THE INVENTION

The present invention relates to an electric energy converter configured to convert a first electric energy into a second electric energy.

The invention also relates to a traction chain, also called power train, for an electric transport vehicle, the traction chain comprising an electric motor and such an electric energy converter, connected to the electric motor.

The invention also relates to an electric transport vehicle, such as a rail vehicle, comprising such a traction chain, configured to cause the vehicle to move.

The electric energy converter comprises two first terminals associated with the first electric energy, at least one second terminal associated with the second electric energy, and P switching arms, P being an integer greater than or equal to 1, each switching arm including two switching half-arms connected in series between the two first terminals and connected to one another at a midpoint, the midpoint being connected to a respective second terminal. Each switching half-arm includes N switching half-branches connected in parallel, N being an integer greater than or equal to 2, each switching half-branch including a switch.

The invention applies to the transportation field, in particular rail transport, particularly to electric traction vehicles, such as locomotives and electric railcars.

BACKGROUND OF THE INVENTION

An electric energy converter of the aforementioned type is known from document US 2013/0039100 A1. The electric energy converter is an inverter able to convert direct energy into three-phase alternating energy to power a three-phase electric motor. The electric energy converter comprises two first terminals associated with the direct energy, three second terminals associated with the three-phase alternating energy, and three switching arms, each switching arm including two switching half-arms connected in series between the first two terminals and connected to one another at a midpoint, the midpoint being connected to a second respective terminal.

Each switching half-arm includes two switching half-branches connected in parallel, or three switching half-branches depending on the considered embodiment, respectively, each switching half-branch including a switch made up of a transistor and a diode connected in antiparallel with the transistor.

The electric energy converter further comprises a control unit for the three switching arms, the control unit being configured to phase shift the switch of one arm relative to the other, in order to deliver the three-phase alternating energy at the output of the electric energy converter.

However, the switching operations of the switching arms are not always optimal.

SUMMARY OF THE INVENTION

The present invention therefore aims to propose an electric energy converter making it possible to improve the switching within each switching arm.

To that end, the invention relates to an electric energy converter of the aforementioned type, wherein the electric energy converter further comprises 2×P control modules, each control module being configured to control the switches of a respective switching half-arm, each control module including an output terminal for each respective switch, each output terminal being configured to deliver a control signal for said respective switch.

The electric energy converter according to the invention then comprises a control module for each switching half-arm, each control module being configured to control the switches of a respective switching half-arm, each control module including a pair of output terminals for each respective switch, each pair of output terminals then being able to deliver a specific control signal to said respective switch.

The electric energy converter according to the invention thus makes it possible to deliver a specific control signal for each respective switch, which makes it possible to improve the switching within each switching arm.

According to other advantageous aspects of the invention, the electric energy converter includes one or more of the following features, considered alone or according to all technically possible combinations:

at least one control module is further configured to synchronize the switching operations of the switches of a respective switching half-arm;

each control module that is able to synchronize the switching operations of the switches of a respective switching half-arm is configured to control the delivery of the control signals of said switches based on predefined switching delays, a predefined switching delay being associated with each of the switches of said switching half-arm;

the electric energy converter comprises a respective control loop for each switch, each control loop being connected between a respective output terminal and the corresponding switch, and including two capacitors and two switching members to switch the corresponding switch into a state from among an open state and a closed state;

at least one switch is a two-way switch;

each two-way switch includes a transistor and a diode connected in antiparallel with transistor;

at least one transistor is made from silicon carbide;

at least one transistor is a field-effect transistor;

preferably an insulated-gate field-effect transistor;

the number P of switching arms is equal to 3; and the number N is equal to 3.

The invention also relates to a traction chain for an electric transport vehicle, the traction chain comprising an electric motor and an electric energy converter connected to the electric motor, the electric energy converter being as defined above.

The invention also relates to an electric transport vehicle, such as a rail vehicle, comprising a traction chain configured to cause the vehicle to move, the traction chain being as defined above.

BRIEF DESCRIPTION OF THE DRAWINGS

The features and advantages of the invention will be better understood upon reading the following description, provided solely as a non-limiting example, and done in reference to the appended drawings, in which.

DETAILED DESCRIPTION OF PREFERRED EMBODIMENTS

Figure 1:
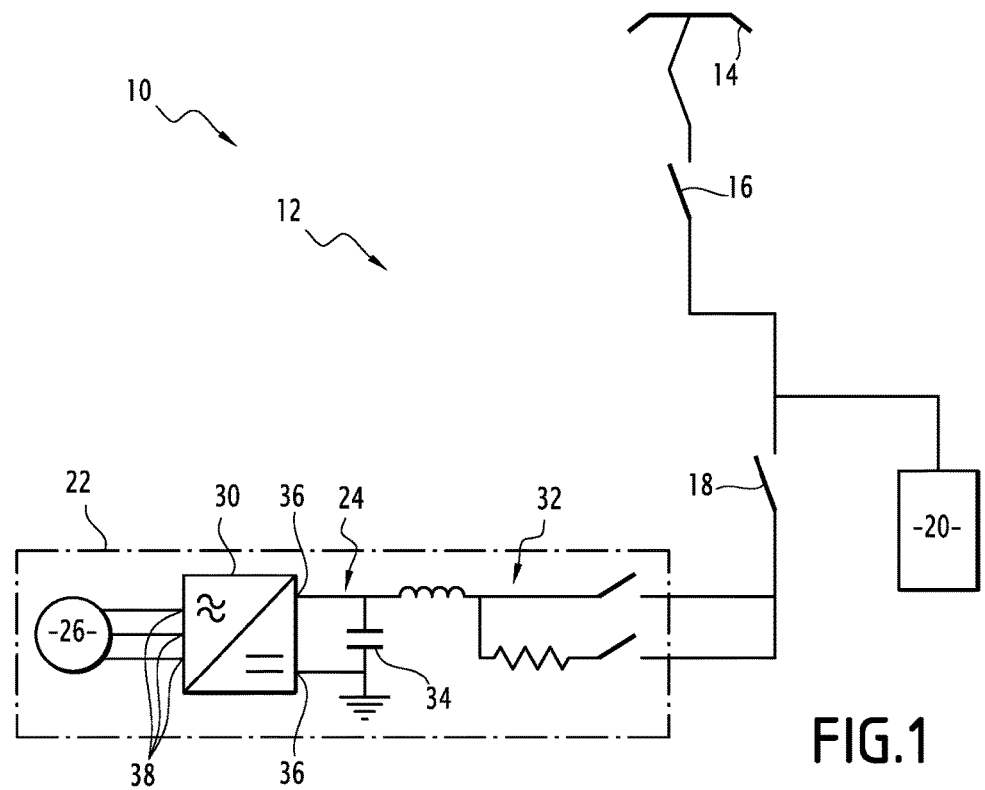
FIG. 1 is a schematic illustration of an electric transport vehicle, such as a rail vehicle, comprising a traction chain, the traction chain including an electric motor and an electric energy converter connected to the electric motor.

In FIG. 1, an electric transport vehicle 10, such as a rail vehicle, comprises a traction chain 12, the traction chain, also called power train, including a pantograph 14 able to be connected to a catenary, not shown.

The traction chain 12 comprises an electric switch 16 connected to the pantograph 14 and an electric circuit breaker 18 connected to the electric switch 16. As an optional addition, the traction chain 12 comprises an auxiliary piece of equipment 20 connected between the electric switch 16 and the electric circuit breaker 18, bypassing the electric circuit breaker 18.

The electric switch 16, the electric circuit breaker 18 and the auxiliary piece of equipment 20 are known in themselves, and are not described in more detail. The auxiliary piece of equipment 20 is for example a static converter.

The traction assembly 22 is connected to the electric circuit breaker 18 via a DC bus 24. The traction assembly 22 includes an electric motor 26, an electric energy converter 30 connected to the electric motor 26. In the example of FIG. 1, the electric energy converter 30 is intended to deliver an alternating voltage to the motor 26 from a direct voltage derived from the DC bus 24.

Additionally, the traction assembly 22 includes a filter device 32, in particular including a filtering capacitor 34.

As an optional addition, the traction assembly 22 includes an electric energy storage device, not shown, the electric energy storage device also being called autonomy box, and serving on the one hand as an auxiliary power source, and on the other hand to collect electric energy during braking of the electric transport vehicle 10. The electric energy storage device is for example connected on a bypass, between the electric circuit breaker 18 and the filtering capacitor 34.

The electric motor 26 is for example an alternating motor, such as a three-phase motor.

The electric energy converter 30 is configured to convert a first electric energy into a second electric energy.

Figure 2:
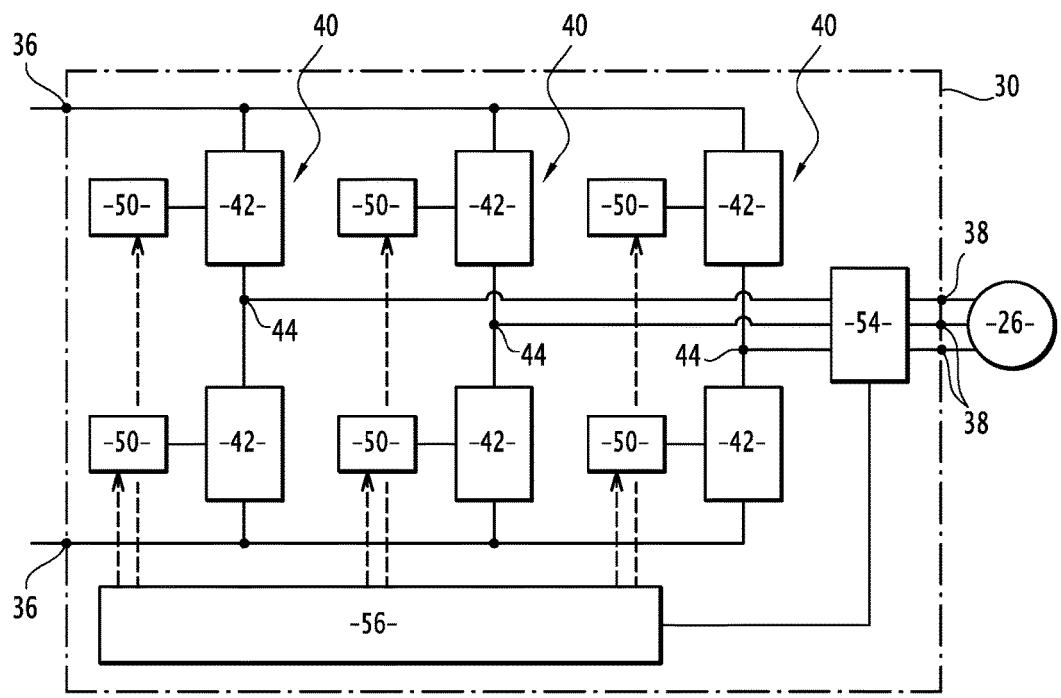
FIG. 2 is a schematic illustration of the electric energy converter of FIG. 1, the converter being configured to convert a first electric energy into a second electric energy, and comprising two first terminals associated with the first electric energy, three second terminals associated with the second electric energy, and three switching arms connected in parallel between the two first terminals.

In the example of FIG. 2, the electric energy converter 30 is configured to convert a direct energy associated with the DC bus 24 into an alternating energy, such as a three-phase energy, associated with the electric motor 26. The first electric energy is then the direct electric energy, and the second electric energy is the alternating energy, such as the three-phase energy.

The electric energy converter 30 comprises two first terminals 36 associated with the first electric energy, at least one second terminal 38 associated with the second electric energy, and P switching arms 40, P being an integer greater than or equal to 1.

In the example of FIG. 2, the electric energy converter 30 converts direct energy into three-phase alternating energy, and then comprises three second terminals 38 and three switching arms 40, i.e., a second terminal 38 and a switching arm 40 for each phase of the three-phase energy. In other words, the number P of switching arms 40 here is equal to 3.

Each switching arm 40 includes two switching half-arms 42 connected in series between the two first terminals 36 and connected to one another at a midpoint 44, the midpoint 44 being connected to a respective second terminal 38.

Figure 3:
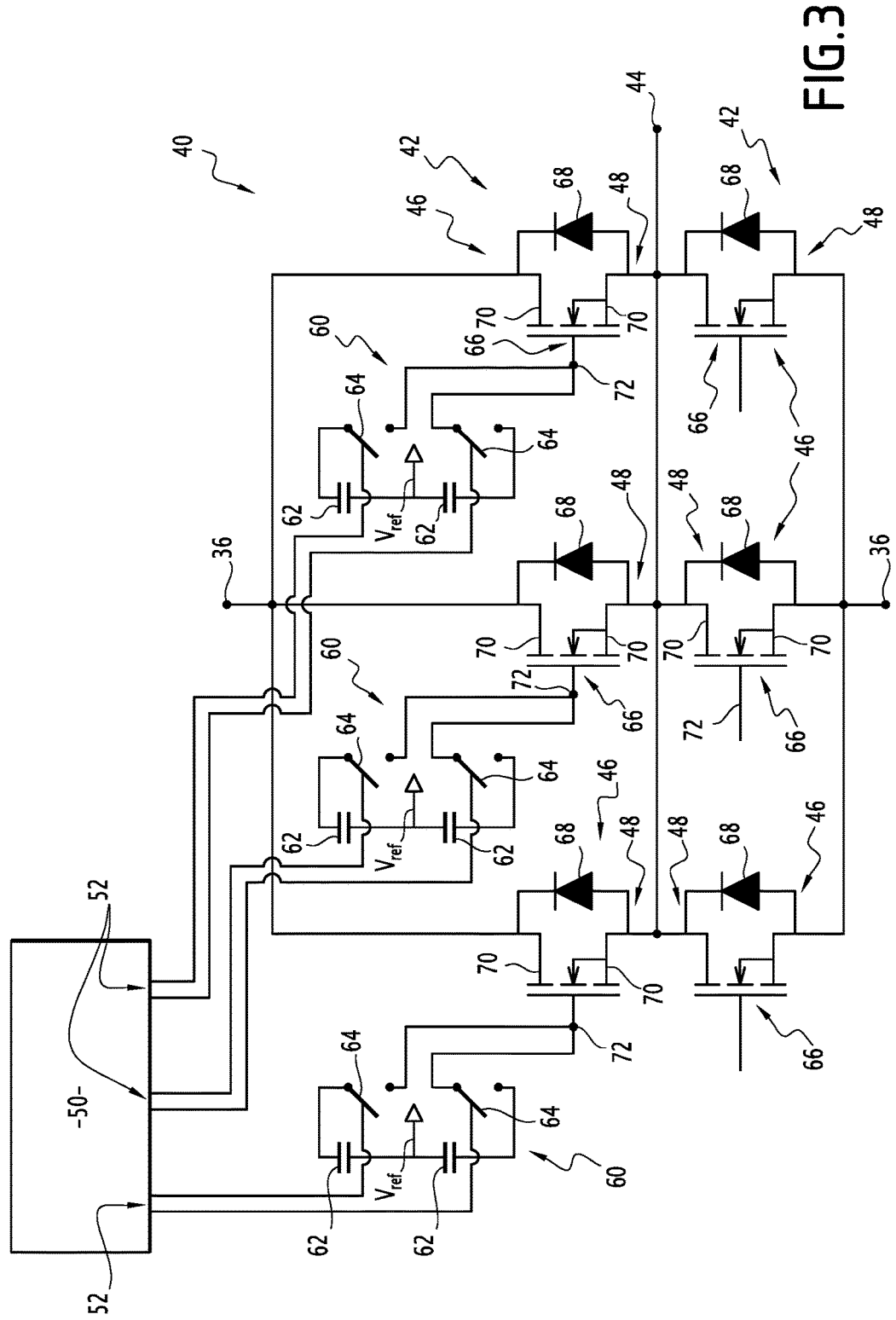
FIG. 3 is a schematic illustration of one of the switching arms of FIG. 2.

Each switching half-arm 42 includes N switching half-branches 46 connected in parallel, N being an integer greater than or equal to 2, each switching half-branch 46 including at least one switch 48, as shown in FIG. 3. Each switching half-arm 42 then includes at least N switches 48.

In the example of FIG. 3, each switching half-arm 42 includes three switching half-branches 46 in parallel, and the number N is then equal to 3.

The electric energy converter 30 further comprises 2×P control modules 50, each control module 50 being configured to control the switches 48 of a respective switching half-arm 42, as shown in FIG. 2. Each control module 50 includes a pair of output terminals 52 for each respective switch 48, each pair of output terminals 52 being configured to deliver a specific control signal for said respective switch 48.

In the example of FIG. 2, the electric energy converter 30 then comprises six control modules 50, P here being equal to 3, with a respective control module 50 for each switching half-arm 42.

The electric energy converter 30 comprises a measuring device 54, shown in FIG. 2, configured to measure at least one electric property relative to the second electric energy, and a driving device 56 configured to drive the different control modules 50, in particular based on the property or properties measured by the measuring device 54.

The electric energy converter 30 comprises a respective control loop 60 for each switch 48, as shown in FIG. 3. Each control loop 60 is connected between a respective output terminal 52 and the corresponding switch 48, and includes two capacitors 62 and two switching members 64 to switch the corresponding switch 48 into a state from among an open state and a closed state.

One skilled in the art will note that in FIG. 3, only the control module 50 and the control loops 60 associated with one of the two switching half-arms 42 of the switching arms 40 in question are shown in order to simplify the drawing, the illustrated control module 50 and control loops 60 being those associated with the upper switching half-arm 42. The control module 50 and the control loops 60 associated with the lower switching half-arm 42 are therefore not shown in FIG. 3.

In the example of FIG. 3, each switching half-branch 46 includes a single switch 48.

In an alternative that is not shown, each switching half-branch 46 includes several switches 48 connected in series between the corresponding second terminal 36 and the respective midpoint 44. This then makes it possible to convert an electric energy with a higher voltage.

At least one switch 48 is for example a two-way switch. Each switch 48 is preferably a two-way switch.

When all of the switches 48 are two-way switches, the electric energy converter 30 is then a two-way converter configured to convert the first electric energy into the second electric energy if the current flows from the first terminals 36 toward the second terminal(s) 38, and conversely configured to convert the second electric energy into the first electric energy if the current flows from the second terminal(s) 38 toward the first terminals 36.

This reversed operation of the electric energy converter 30 to convert the second electric energy into the first electric energy is in particular useful to recover energy during braking of the electric transport vehicle 10.

Each two-way switch 48 for example includes a transistor 66 and a diode 68 connected in antiparallel with transistor 66. As is known in itself, each transistor 66 includes two conducting electrodes 70 and one control electrode 72, each transistor 66 being controllable, via its control electrode 72, between a state from among an on state, in which the current flows between the conducting electrodes 70, and an off state, in which the current does not flow between the conducting electrodes 70. The diode 68 is then connected between the conducting electrodes 70.

Alternatively, each two-way switch 48 has no diode connected in antiparallel with the transistor, and the transistor is advantageously an insulated-gate field-effect transistor, more commonly called MOSFET.

At least one control module 50 is for example further configured to synchronize the switching operations of the switches 48 of a respective switching half-arm 42. Each control module 50 is preferably configured to synchronize the switching operations of the switches 48 of the respective switching half-arm 42 with which it is associated.

Each control module 50 that is able to synchronize the switching operations of the switches 48 of a respective switching half-arm 42 is configured to control the delivery of the control signals of said switches 48 based on predefined switching delays, a predefined switching delay being associated with each of the switches 48 of said switching half-arm 42.

In other words, each control module 50 is then able to deliver the control signals to the control loops 60, in particular to their switching members 64, in an offset manner from one control loop 60 to the other, based on the characteristics of the switches 48, in particular based on the predefined switching delays associated with them.

One skilled in the art will then understand that each control module 50 seeks to delay the switching of the switch 48 tending to switch most quickly among the various switches 48 of the switching half-arm 42 in question, and on the contrary to command the switching as early as possible of the switch 48 tending to switch the most slowly from among said various switches 48 of this switching half-arm 42.

Each control module 50 is for example made in the form of a programmable logic component, such as an FPGA (Field-Programmable Gate Array). The electric energy converter 30 for example comprises 2×P programmable logic components, each forming a respective control module 50. Alternatively, at least two control modules 50 are made on a single programmable logic component, while being separate with respect to the specific output terminals 52 for each control module 50.

These predefined switching delays are for example determined over the course of preliminary tests done on the switches 48, in particular on the transistors 66. Indeed, these delays or switching times are specific to each switch 48, in particular each transistor 66, since they depend on intrinsic characteristics of these components, variables from one component to the other, in particular from one transistor 66 to the other, and resulting from manufacturing.

The measuring device 54 is for example configured to measure the intensity of each current flowing through a second respective terminal 38 and/or the voltage in this second terminal 38, i.e., the current traversing the corresponding second midpoint 44 and/or the voltage at this second midpoint 44.

The driving device 56 is configured to drive the different control modules 50, and thus to control the different switching half-arms 42 in order to perform the energy conversion.

The driving of the control modules 50 is in particular done based on the property or properties measured by the measuring device 54.

Each control loop 60 is preferably an essentially analog loop, where the switching members 64 are for example transistors, such as MOS transistors, and the capacitors 62 serve to provide the energy reserves to drive the control electrodes 72 at the appropriate voltage to control the corresponding transistor 66 in the desired state from among the on state and the off state.

Each control loop 60 has a very short length, typically around one or several centimeters.

Each control loop 60 has a very low inductance, for example around several tens of nH, such as around 20 nH.

At least one transistor 66 for example is made from silicon carbide (SiC). Each transistor 66 is preferably made from silicon carbide.

At least one transistor 66 is for example a field-effect transistor (FET), preferably an insulated-gate field-effect transistor, more commonly called MOSFET, or a metal-oxide semiconductor field effect transistor. Each transistor 66 is preferably a MOSFET transistor. The conducting electrodes 70 are then drain and source electrodes, and the control electrode 72 is a gate electrode.

Alternatively, each transistor 66 is an insulated gate bipolar transistor (IGBT). The conducting electrodes 70 are then collecting and transmitting electrodes, and the control electrode 72 is a gate electrode.

Thus, each switching half-arm 42 can be controlled independently from one switching half-arm to the other, with a control module 50 for each switching half-arm 42 that is configured to control the switches 48 of this switching half-arm 42.

Furthermore, the fact that each control module 50 includes a respective output terminal 52 for each switch 48 makes it possible to control each switch 48 individually, which makes it possible to take specificities into account for each switch 48, in particular resulting from their manufacturing.

This then makes it possible to improve the switching within each switching half-arm 42, and therefore within each switching arm 40.

The switching within each switching half-arm 42 is further improved when the control modules 50 are further configured to synchronize the switching operations of the switches 48 of each switching half-arm 42. This makes it possible to still better resolve the intrinsic disparities between the switches 48, in particular between the transistors 66, these disparities for example being inherent to the manufacturing of these transistors 66 and in particular resulting in variable switching delays, or times, from one switch 48 to the other, in particular from one transistor 66 to the other. The disparities can also be related to the specific action on each switch 48 of the field generated by the transitions of the switches 48, from the on state to the off state, or vice versa, from the off state to the on state.

When the transistors 66 are transistors made from silicon carbide, their switching is much faster, which makes it possible to further improve the operation of the electric energy converter 30 according to the invention.

As an example, the switching of a transistor 66 made from silicon carbide is generally done in a delay comprised between 70 and 100 ns, and is about 5 to 10 times faster than that of a transistor made from silicon, which generally occurs in a delay of about 500 ms to 1 μs.

One can thus see that the electric energy converter 30 according to the invention makes it possible to improve the switching within each switching arm 40.

The invention claimed is:

1. An electric energy converter configured to convert a first electric energy into a second electric energy, comprising:
   two first terminals associated with the first electric energy;
   at least one second terminal associated with the second electric energy; and
   P switching arms, P being an integer greater than or equal to 1, each switching arm including two switching half-arms connected in series between the two first terminals and connected to one another at a midpoint, the midpoint being connected to a respective second terminal,
   wherein each switching half-arm includes N switching half-branches connected in parallel, N being an integer greater than or equal to 2, each switching half-branch including a switch,
   wherein the electric energy converter further comprises 2×P control modules, each control module being configured to control the switches of a respective switching half-arm, each control module including an output terminal for each respective switch, each output terminal being configured to deliver a control signal for said respective switch, and
   wherein the electric energy converter comprises a respective control loop for each switch, each control loop being connected between a respective output terminal and the corresponding switch, and including two capacitors and two switching members to switch the corresponding switch into a state from among an open state and a closed state,
   wherein at least one control module is further configured to synchronize the switching operations of the switches of a respective switching half-arm; and
   wherein each control module that is able to synchronize the switching operations of the switches of a respective switching half-arm is configured to control the delivery of the control signals of said switches based on predefined switching delays, a predefined switching delay being associated with each of the switches of said switching half-arm.

2. The electric energy converter according to claim 1, wherein at least one switch is a two-way switch.

3. The electric energy converter according to claim 2, wherein each two-way switch includes a transistor and a diode connected in antiparallel with transistor.

4. The electric energy converter according to claim 3, wherein at least one transistor is made from silicon carbide.

5. The electric energy converter according to claim 3, wherein at least one transistor is a field-effect transistor.

6. The electric energy converter according to claim 1, wherein the number P of switching arms is equal to 3.

7. The electric energy converter according to claim 1, wherein the number N is equal to 3.

8. A traction chain for an electric transport vehicle, the traction chain comprising an electric motor and an electric energy converter connected to the electric motor,
   wherein the electric energy converter is the electric energy converter according to claim 1.

9. An electric transport vehicle comprising a traction chain configured to cause said electric transport vehicle to move,
   wherein the traction chain is the traction chain according to claim 8.

* * * * *